(12) United States Patent
Suzuki et al.

(10) Patent No.: US 7,662,685 B2
(45) Date of Patent: Feb. 16, 2010

(54) SEMICONDUCTOR DEVICE AND MANUFACTURING METHOD THEREOF

(75) Inventors: Masamichi Suzuki, Yokohama (JP); Takeshi Yamaguchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 110 days.

(21) Appl. No.: 11/234,217

(22) Filed: Sep. 26, 2005

(65) Prior Publication Data

US 2006/0086993 A1  Apr. 27, 2006

(30) Foreign Application Priority Data

Oct. 21, 2004  (JP) .............................. 2004-307027

(51) Int. Cl.
*H01L 21/8242* (2006.01)

(52) U.S. Cl. ............... 438/253; 438/243; 257/E21.347; 257/E21.475; 257/E21.596

(58) Field of Classification Search ................. 438/253, 438/243, 257, E21.347, E21.475, E21.596
See application file for complete search history.

(56) References Cited

U.S. PATENT DOCUMENTS

| 6,791,125 | B2 * | 9/2004 | Demkov et al. ............. 257/192 |
| 7,005,717 | B2 * | 2/2006 | Eisenbeiser et al. ......... 257/410 |
| 7,005,719 | B2 * | 2/2006 | Masumoto ................. 257/432 |
| 7,106,630 | B2 * | 9/2006 | Hamaguchi et al. ..... 365/185.18 |
| 7,115,955 | B2 * | 10/2006 | Messenger et al. .......... 257/369 |
| 2003/0111678 | A1 * | 6/2003 | Colombo et al. ............ 257/240 |
| 2005/0023624 | A1 * | 2/2005 | Ahn et al. ................... 257/410 |
| 2005/0250319 | A1 * | 11/2005 | Carruthers et al. .......... 438/655 |

FOREIGN PATENT DOCUMENTS

JP        2003-249497        9/2003

OTHER PUBLICATIONS

L. F. Edge et al., "Measurement of the Band Offsets Between Amorphous $LaAlO_3$ and Silicon", Applied Physics Letters, Feb. 2, 2004, pp. 726-728, vol. 84, No. 3, American Institute of Physics.

Ai-Dong Li et al., "Characteristics of $LaAlO_3$ Gate Dielectrics on Si Grown by Metalorganic Chemical Vapor Deposition", Applied Physics Letters, Oct. 27, 2003, pp. 3540-3542, vol. 83, No. 17, American Institute of Physics.

X. B. Lu et al., "Interfacial Structures of $LaAlO_3$ Films on Si(100) Substrates", Applied Physics A, vol. 78, Apr. 11, 2003, pp. 921-923.

(Continued)

*Primary Examiner*—N Drew Richards
*Assistant Examiner*—Swapneel Chhaya
(74) *Attorney, Agent, or Firm*—Finnegan, Henderson, Farabow, Garrett & Dunner, L.L.P.

(57) ABSTRACT

A semiconductor device includes a Si substrate, a gate insulating film formed on the Si substrate, the gate insulating film being formed of an oxide film containing at least one selected from the group of Zr, Hf, Ti and a lanthanoid series metal, and having a single local minimal value on a high binding energy side of an inflection point in first differentiation of an O1s photoelectron spectrum, and a gate electrode formed on the gate insulating film.

4 Claims, 7 Drawing Sheets

OTHER PUBLICATIONS

Masahiro Koike et al., "Effect of Hf-N bond on Properties of Thermally Stable Amorphous HfSiON and Applicability of this Material to Sub-50nm Technology Node LSIs", IEEE, 2003, pp. 4.7.1 to 4.7.4.

Notification of Reasons for Rejection mailed by the Japanese Patent Office on Dec. 18, 2007, for Japanese Patent Application No. 2004-307027, and an English-language translation thereof.

* cited by examiner

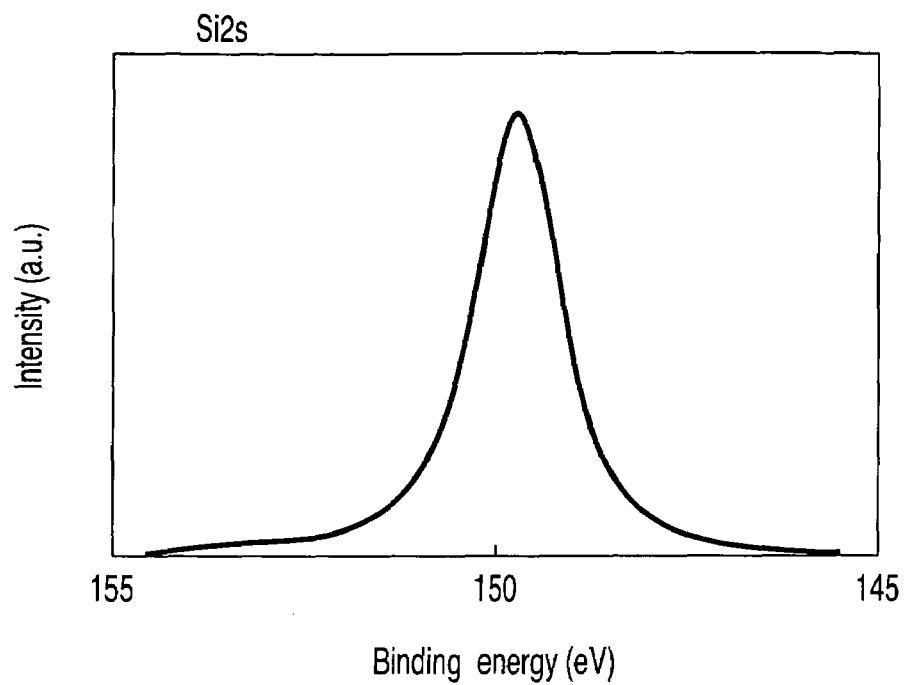
F I G. 1
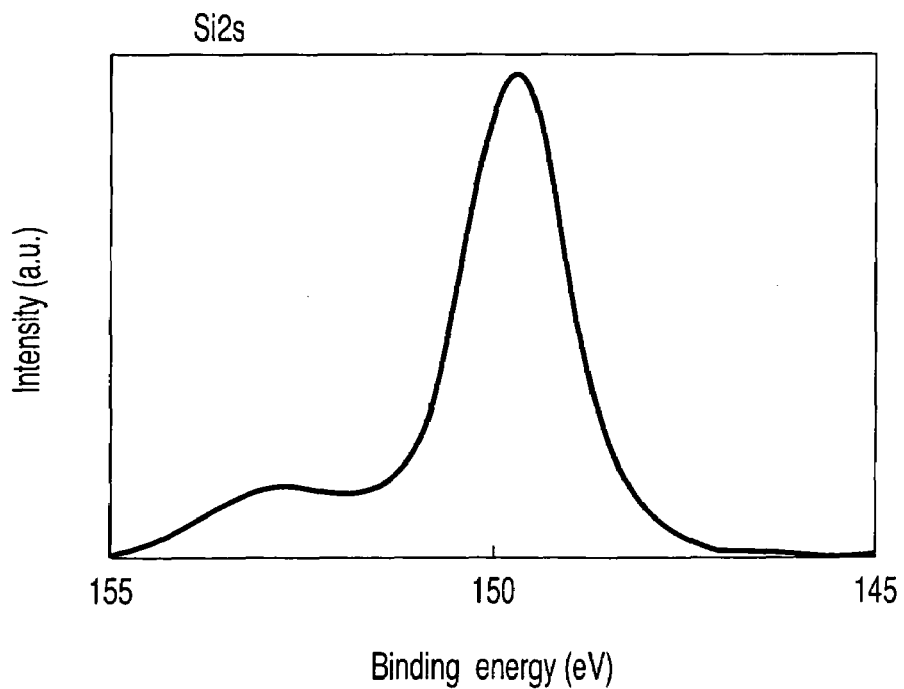
F I G. 2

| Oxide | SiO$_2$ | Al$_2$O$_3$ | La$_2$O$_3$ | HfO$_2$ | ZrO$_2$ | TiO$_2$ |
|---|---|---|---|---|---|---|
| $\Delta H°$ (kJ·mol$^{-1}$) | -910.7 | -1675.7 | -1793.7 | -1144.7 | -1100.6 | -944.0 |
FIG. 11
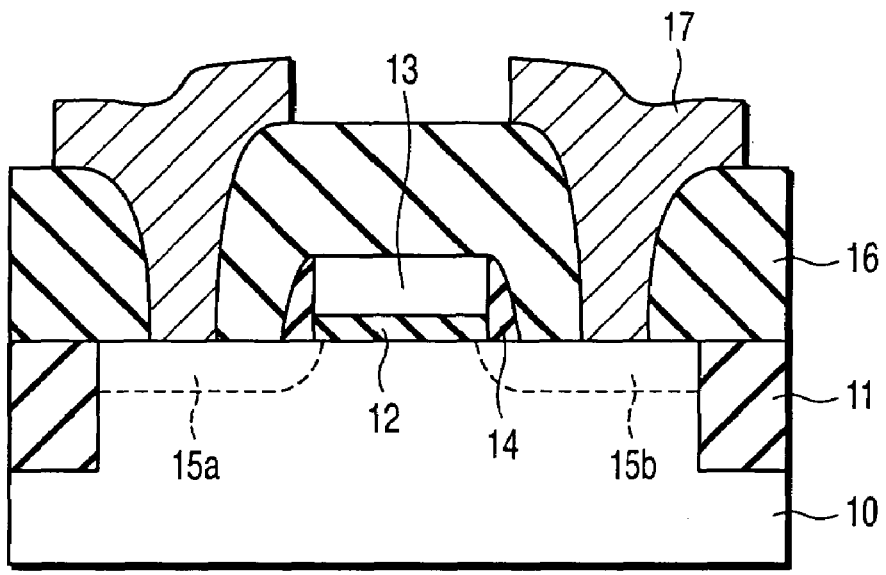
FIG. 12
FIG. 13A

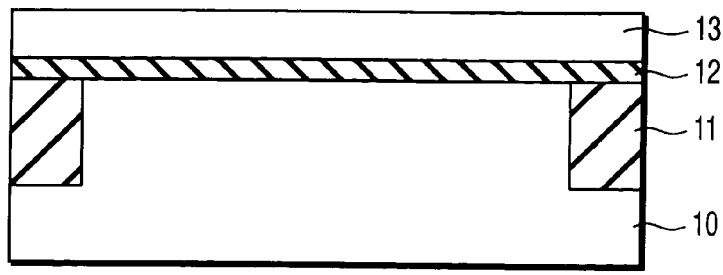
F I G. 13B
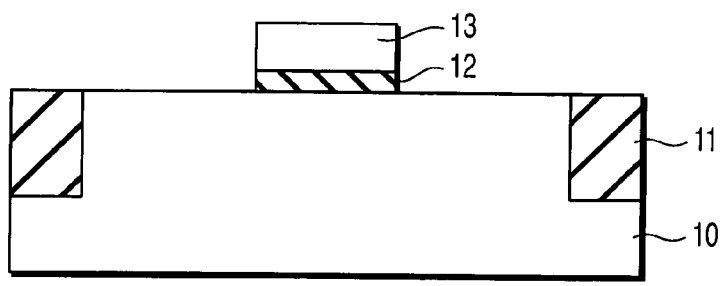
F I G. 13C
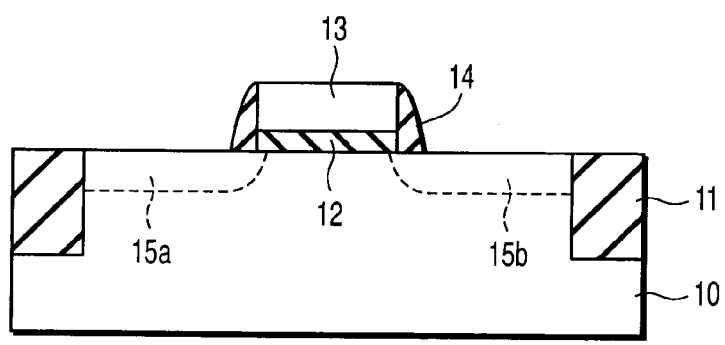
F I G. 13D
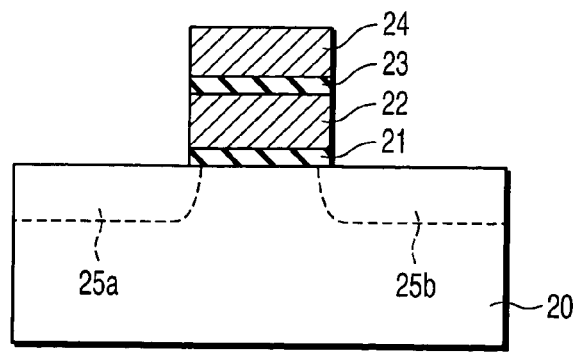
F I G. 14

US 7,662,685 B2

SEMICONDUCTOR DEVICE AND MANUFACTURING METHOD THEREOF

CROSS-REFERENCE TO RELATED APPLICATIONS

This application is based upon and claims the benefit of priority from prior Japanese Patent Application No. 2004-307027, filed Oct. 21, 2004, the entire contents of which are incorporated herein by reference.

BACKGROUND OF THE INVENTION

1. Field of the Invention

The present invention relates to a semiconductor device and a manufacturing method thereof, and more particularly relates to a semiconductor device having a high-dielectric-constant gate insulating film and to a manufacturing method thereof.

2. Description of the Related Art

Development of Si-LSI has been achieved by a size reduction of elements in accordance with a scaling law. According to this scaling law, a gate insulating film in a next-generation MOS-type field effect transistor having a gate length less than 0.1 μm is required to have a film thickness of 1.5 nm or less in terms of an equivalent thickness of $SiO_2$.

In a case of $SiO_2$, leakage current due to direct tunnel current cannot be restrained in an area of this film thickness, and this increases power consumption, so that $SiO_2$ cannot be applied as the gate insulating film any longer in a next generation. Thus, to provide an alternative material, research and development have been intensively conducted for a high-dielectric-constant insulating film, that is, a high-k film which has a high dielectric constant and an increased film thickness so that the leakage current can be restrained, and many high-k materials have been proposed so far (e.g., refer to IEDM Tech. Dig. (2003) 107.).

However, in most of the high-k films heretofore proposed, the high-k film reacts with a Si substrate to generate a low-dielectric-constant interfacial layer at an interface therebetween. The generation of the undesired low-dielectric-constant interfacial layer is caused by a heat treatment during or after film formation. The generation of the low-dielectric-constant interfacial layer then results in a decrease in the dielectric constant as the gate insulating film, which is a primary factor preventing utilization of the high-dielectric-constant characteristics intrinsic to the high-k material.

There has thus been a demand to achieve a semiconductor device and a manufacturing method thereof which prevent the generation of the low-dielectric-constant interfacial layer during the film formation, can also restrain the generation of the low-dielectric-constant interfacial layer after the heat treatment and effectively use the high-k film as the gate insulating film.

BRIEF SUMMARY OF THE INVENTION

According to a first aspect of the invention, there is provided a semiconductor device which comprises:

a Si substrate;

a gate insulating film formed on the Si substrate; the gate insulating film being formed of an oxide film containing at least one selected from the group consisting of Zr, Hf, Ti and a lanthanoid series metal, and having a single local minimal value on a high binding energy side of an inflection point in first differentiation of an O1s photoelectron spectrum, and a gate electrode formed on the gate insulating film.

According to a second aspect of the invention, there is provided a semiconductor device which comprises:

a Si substrate;

a gate insulating film formed on the Si substrate; the gate insulating film being formed of an oxide film containing at least one selected from the group consisting of Zr, Hf, Ti and a lanthanoid series metal, an O1s spectrum of a photoelectron spectrum being symmetric with respect to a peak position and having a smooth and monotonous change, and a gate electrode formed on the gate insulating film.

According to a third aspect of the invention, there is provided a method of manufacturing a semiconductor device which comprises:

forming an oxide film containing at least one selected from the group consisting of Zr, Hf, Ti and a lanthanoid series metal as a gate insulating film on a Si substrate in an atmosphere in a temperature region of 500° C. to 800° C. and under an oxygen partial pressure of $1\times10^{-4}$ Pa or less; and forming a gate electrode on the gate insulating film.

BRIEF DESCRIPTION OF THE SEVERAL VIEWS OF THE DRAWING

FIG. 1 is a diagram showing an Si2s photoelectron spectrum in an LaAlO film/Si structure formed at a room temperature;

FIG. 2 is a diagram showing an Si2s photoelectron spectrum after a sample of FIG. 1 has been subjected to Au deposition, a heat treatment and Au removal;

FIG. 11 shows standard enthalpy of formation for various oxides at 25° C.;

FIG. 12 is a sectional view showing an element structure of a semiconductor device (MOS transistor) according to a second embodiment;

FIGS. 13A to 13D are sectional views showing a manufacturing process of the semiconductor device step by step according to the second embodiment; and FIG. 14 is a sectional view showing an element structure of a nonvolatile semiconductor memory cell having a double layer gate structure to explain a modification of the present invention.

DETAILED DESCRIPTION OF THE INVENTION

Figure 3:
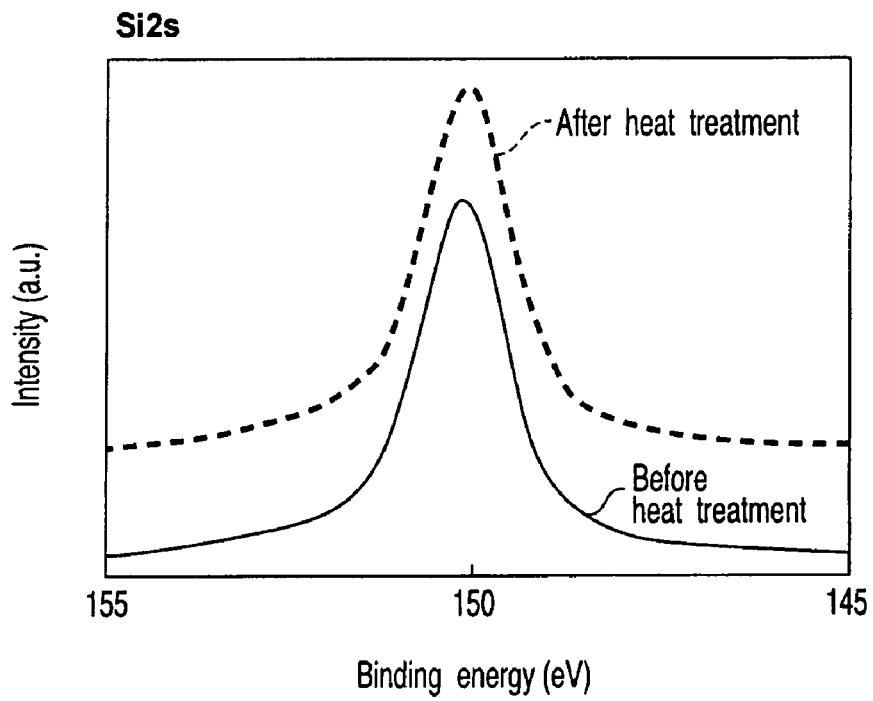
FIG. 3 is a diagram showing an Si2s photoelectron spectrum in the LaAlO film/Si structure before and after the heat treatment when a film formation temperature is changed to 500° C. under the film formation condition for the sample of FIG. 1.

According to embodiments of the present invention described below, an oxide film formed in a manner to include at least one of Zr, Hf, Ti and a lanthanoid series metal is used as a gate insulating film, and it is thereby possible to sufficiently increase a dielectric constant of the gate insulating film and contribute to realization of a next-generation MOS-type field effect transistor. In this case, since a low-dielectric-constant interfacial layer cannot be generated, it is possible to take advantage of the high-dielectric-constant characteristics intrinsic to a high-k material.

Similar effects can also be provided if the gate insulating film is used as an inter-electrode insulating film of a nonvolatile semiconductor memory cell having a double layer gate structure.

Furthermore, the gate insulating film is formed at a temperature range from 500° C. to 800° C. and under an oxygen partial pressure of $1 \times 10^{-4}$ Pa, so that the generation of the low-dielectric-constant interfacial layer during film formation can be restrained, and the generation of the low-dielectric-constant interfacial layer can also be restrained after a heat treatment, thereby making it possible to realize a satisfactory insulating film structure having a uniform coordination environment of oxygen.

The embodiments of the present invention will hereinafter be described with reference to the drawings.

First Embodiment

In a first embodiment, an example will be described wherein an LaAlO gate insulating film is deposited by a laser ablation method.

FIG. 1 shows an Si2s photoelectron spectrum in an LaAlO film which is formed at a thickness of 5 nm at a room temperature in an atmosphere under an oxygen partial pressure of $5 \times 10^{-5}$ Pa by the laser ablation method using an LaAlO$_3$ single-crystal substrate as a target, on an n-type silicon (100) substrate in which a native oxide film has been removed by dipping diluted HF solution. A strong peak in the vicinity of 150 eV is attributed to a Si substrate. When Si constituting the substrate causes a reaction and a low-dielectric-constant interfacial layer is generated, a peak resulting from a Si oxide is observed in the vicinity of 153 eV, but such a peak is not observed in FIG. 1, and it is thus understood that the low-dielectric-constant interfacial layer is not generated at a room temperature under an oxygen partial pressure of $5 \times 10^{-5}$ Pa.

In comparison with a sample of FIG. 1, FIG. 2 shows an Si2s photoelectron spectrum, wherein in order to prevent oxygen from being mixed into the insulating film from the outside of the sample, an Au layer having a thickness of 2 μm is deposited on LaAlO, and a heat treatment is then conducted at 400° C. in a ultra-high vacuum ($1 \times 10^{-7}$ Pa) for ten minutes, and the Au layer is then removed, thereby measuring the Si2s photoelectron spectrum. In FIG. 2, a peak resulting from the Si oxide and indicating the generation of the low-dielectric-constant interfacial layer is clearly observed in the vicinity of 153 eV in addition to the peak attributed to the Si substrate. The low-dielectric-constant interfacial layer is generated in a state where the Au cap layer is provided and further deposited in the ultra-high vacuum to eliminate possibility of oxygen mixed from the outside as in the condition described above, and this fact means that oxygen constituting LaAlO which is the gate insulating film is provided to Si.

Thus, when the LaAlO insulating film is formed at a room temperature, oxygen is provided from the insulating film to Si and the low-dielectric-constant interfacial layer is generated in spite of the heat treatment condition at a relatively low temperature of 400° C. for a Si-LSI process. This phenomenon should be restrained when considering the heat treatment in the Si-LSI process after the formation of the gate insulating film.

Next, FIG. 3 shows an Si2s photoelectron spectrum in the LaAlO film formed under the same condition except that a film formation temperature is changed to 500° C., and additionally shows an Si2s photoelectron spectrum after the Au layer is deposited so that the same sample is subjected to the heat treatment at 400° C. in the ultra-high vacuum ($1 \times 10^{-7}$ Pa) for ten minutes similarly to the sample described above. As apparent from FIG. 3, the peak of the Si oxide attributed to the generation of the interfacial layer is not observed immediately after the film formation as in the case where the film is formed at a room temperature. Further, in this sample wherein the film is formed at 500° C., no change is observed in a shape of the peak thereof even in the heat treatment after the deposition of the Au layer, and the low-dielectric-constant interfacial layer is not generated. This means that a change in a film structure caused by the film formation at 500° C. has restrained the provision of oxygen to the Si substrate.

Figure 4:
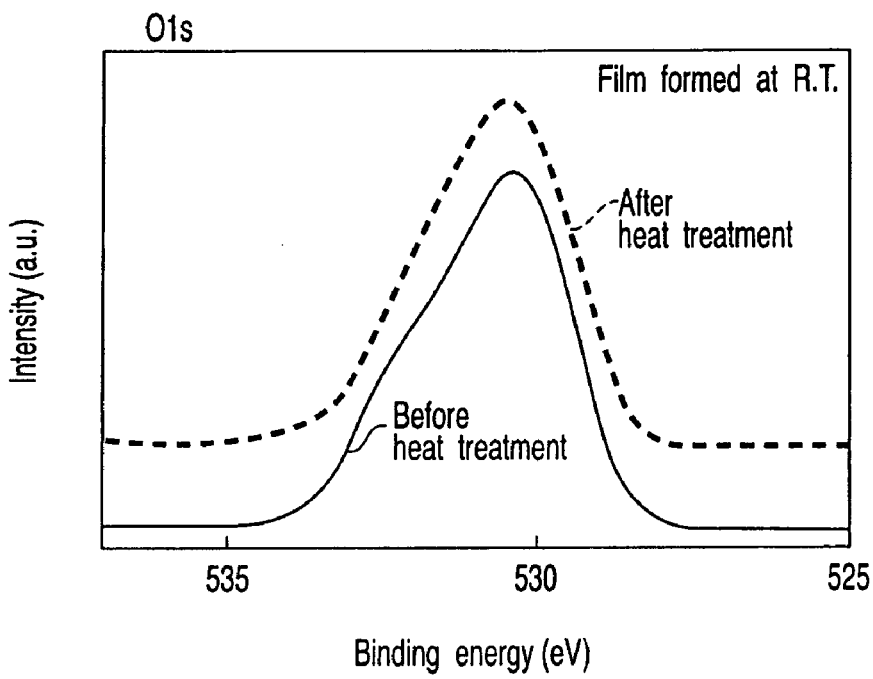
FIG. 4 is a diagram showing an O1s photoelectron spectrum before and after the heat treatment to the sample a film of which is formed at a room temperature.
Figure 5:
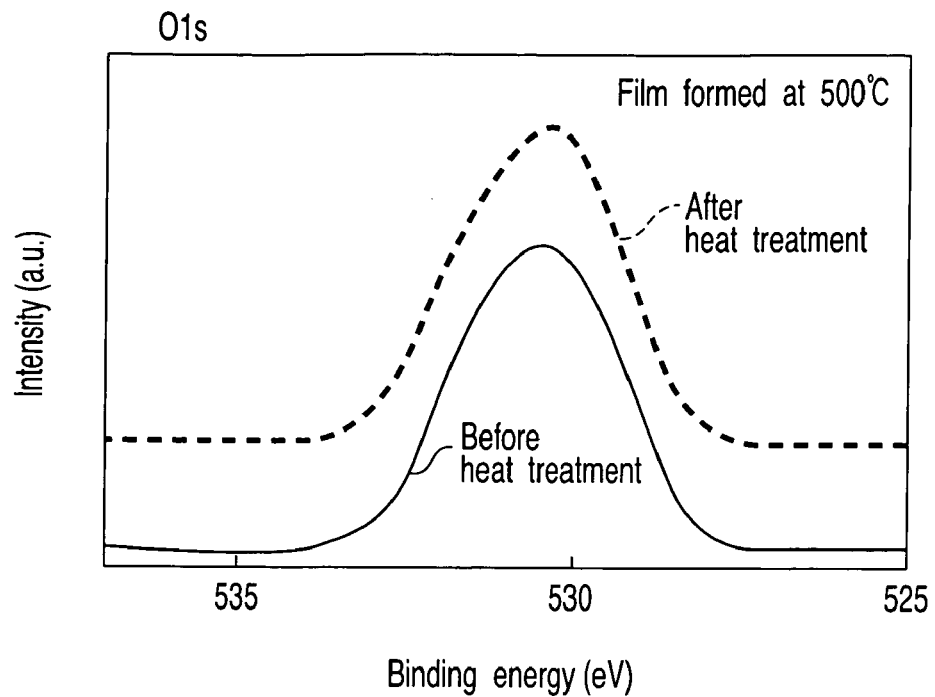
FIG. 5 is a diagram showing an O1s photoelectron spectrum of the film before and after the heat treatment where the film is formed at 500° C.

The change in the film structure is clearly observed in an O1s photoelectron spectrum. FIGS. 4 and 5 show O1s photoelectron spectrums before and after the heat treatment in which the films are formed at a room temperature and 500° C., respectively. FIG. 4 shows the case where the film is formed at a room temperature, and FIG. 5 shows the case where the film is formed at 500° C.

As shown in FIG. 5, regarding a bonding state of oxygen when the film is formed at 500° C., no change is observed between before and after the heat treatment, and symmetry of its peak shape shows a uniform coordination environment of oxygen. Here, it is considered that chain bonds of La—O—Al are generated.

On the contrary, as shown in FIG. 4, in the case of the sample in which the film is formed at a room temperature, not only a strong peak in the vicinity of 530 eV after the heat treatment, but also a shoulder peak on a high binding energy side thereof is observed. That is, in this case, there exists a structure having a plurality of bonding states instead of the uniform bonding state observed when the film is formed at 500° C. In other words, there exists a structure different from the chain bond of La—O—Al, and this has conceivably caused the provision of oxygen to Si and therefore the generation of the low-dielectric-constant interfacial layer. Moreover, when the film is formed at a room temperature, it is considered that the O1s photoelectron spectrum has a symmetric shape and a uniform bonding state is created if the above-mentioned heat treatment is conducted, and it is thus possible to conclude that a nonuniform bonding state in an initial state, that is before the heat treatment, causes the generation of the low-dielectric-constant interfacial layer by the heat treatment.

Figure 6:
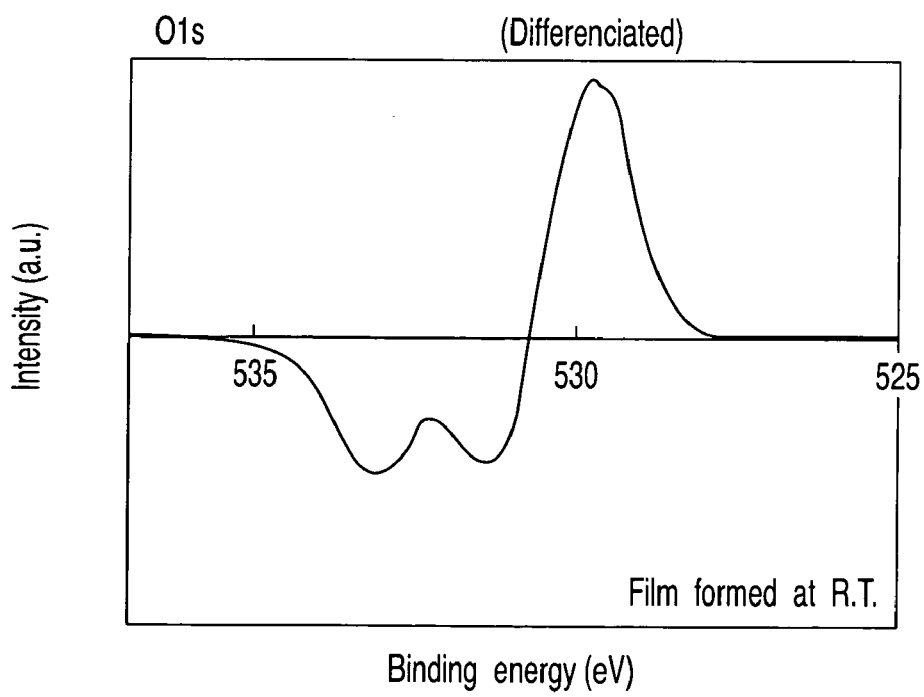
FIG. 6 is a diagram showing an O1s first differentiation photoelectron spectrum of the film which is formed at a room temperature.
Figure 7:
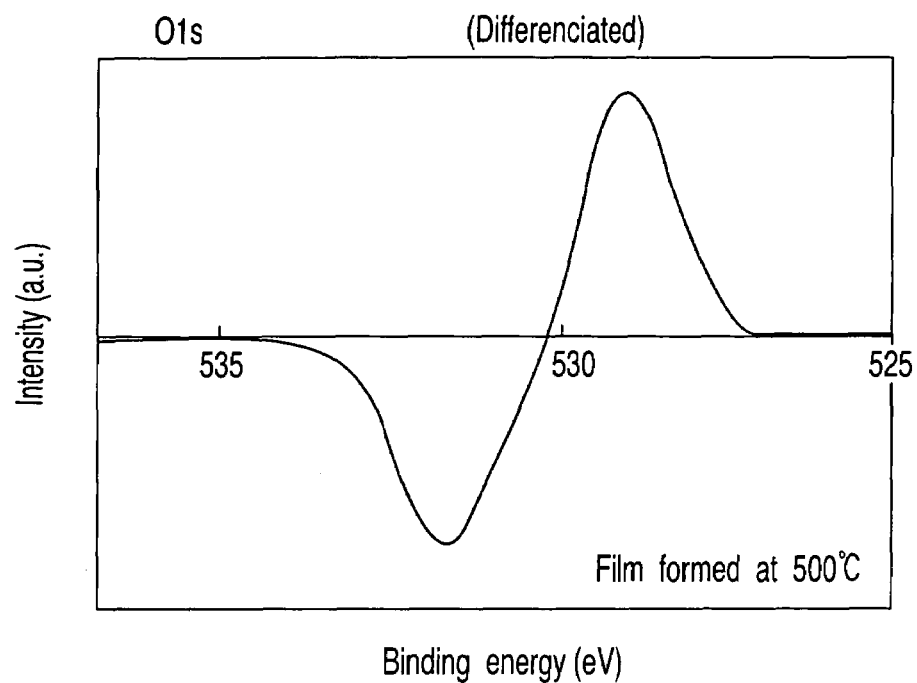
FIG. 7 is a diagram showing an O1s first differentiation photoelectron spectrum of the film which is formed at 500° C.

To more clearly show a difference of the peak shapes, FIGS. 6 and 7 present O1s photoelectron spectrums subjected to first differentiation before the heat treatment of the samples in the cases where the films are formed at a room temperature and 500° C., respectively. FIG. 6 shows the case where the film is formed at a room temperature, and FIG. 7 shows the case where the film is formed at 500° C.

It is understood that in FIG. 7, one local minimal value and one local maximal value exist on a high binding energy side and a low binding energy side of an inflection point, respectively, but two local minimal values exist on the high binding energy side of the inflection point in FIG. 6, which clearly shows that a plurality of states is present in the film. This signifies that what is important to restrain the generation of the low-dielectric-constant interfacial layer is a structure in which only one local minimal value and only one local maximal value exist on the high binding energy side and the low binding energy side of the inflection point, respectively, as in FIG. 7, in particular, a structure in which a single local maximal value is maintained on the high binding energy side of the inflection point.

Figure 8:
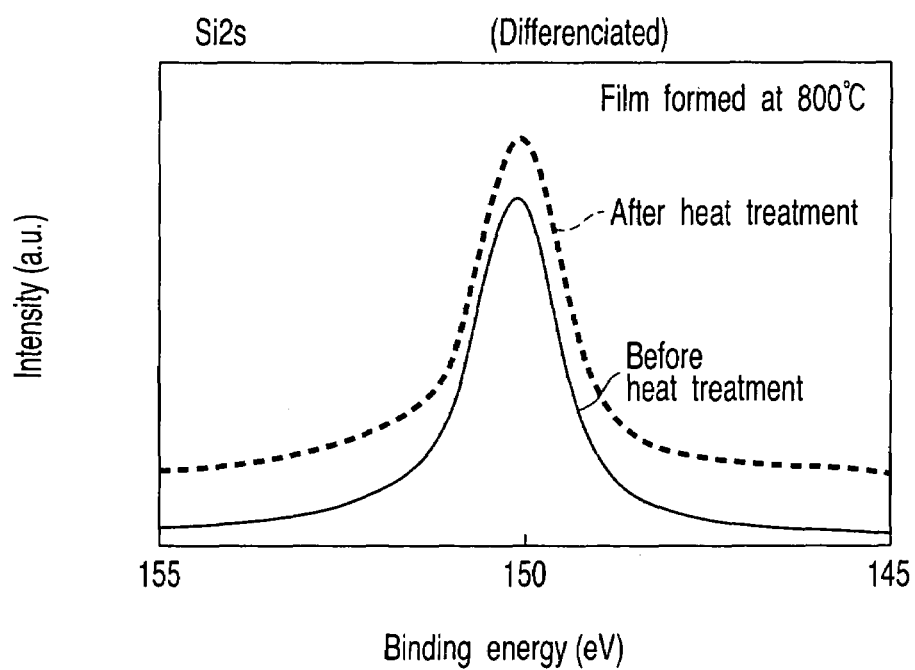
FIG. 8 is a diagram showing an Si2s photoelectron spectrum before and after the heat treatment with respect to an LaAlO film formed at 800° C.
Figure 9:
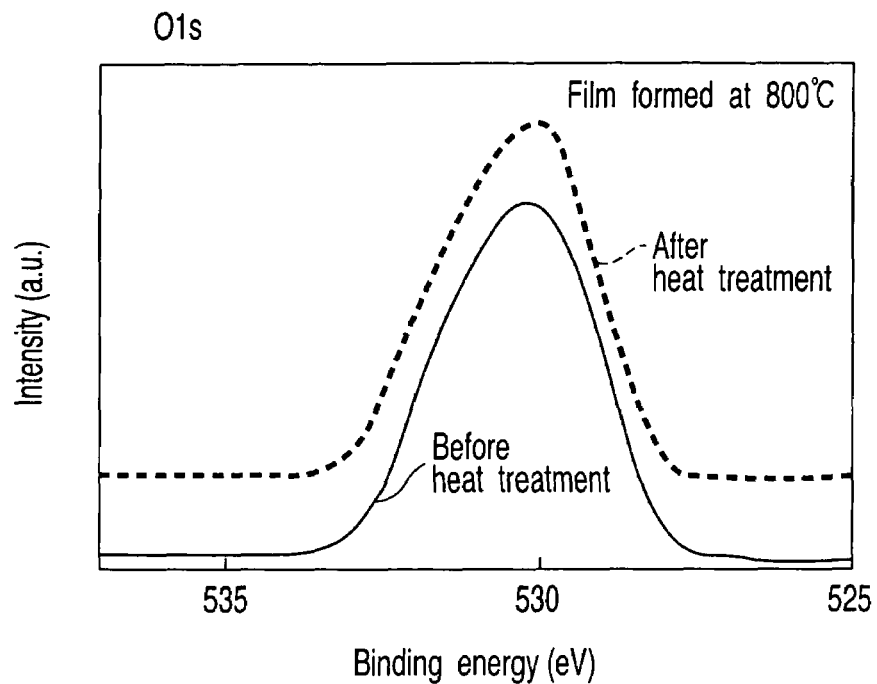
FIG. 9 is a diagram showing an O1s photoelectron spectrum before and after the heat treatment with respect to the LaAlO film formed at 800° C.

Furthermore, no change is seen in such shapes of the Si2s and O1s photoelectron spectrums as observed in the sample in which the film is formed at 500° C. even if the film formation temperature is changed to 800° C., as shown in FIGS. 8 and 9. FIG. 8 shows an Si2s photoelectron spectrum, and FIG. 9 shows an O1s photoelectron spectrum. It has further been found out that if the film formation temperature is changed to 850° C., the LaAlO film is crystallized, and the low-dielectric-constant interfacial layer is generated at a stage of the film deposition.

It has also been found out that regarding the atmosphere for the film formation, the low-dielectric-constant interfacial layer is not generated even at the stage of the film formation under an oxygen partial pressure of $1\times10^{-4}$ Pa or less, and that the low-dielectric-constant interfacial layer is generated at the stage of the film formation under an oxygen partial pressure of $2\times10^{-4}$ Pa or more.

Figure 10:
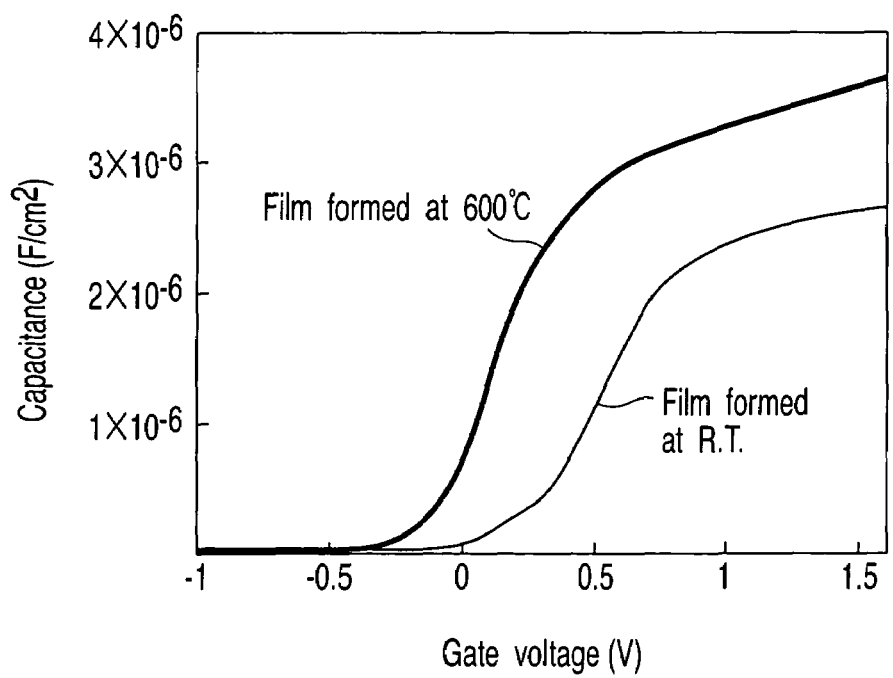
FIG. 10 is a diagram showing characteristics of capacitance of Mo/LaAlO/Si-MIS capacitors manufactured at a film formation temperature of 600° C. and at a room temperature in relation to a gate voltage.

FIG. 10 shows a result of measuring a relation between capacitance and a gate voltage of MIS capacitors using Mo gate electrode, wherein insulator films are formed at a room temperature and 600° C. in an atmosphere of $1\times10^{-4}$ Pa, and they are then subjected to the same heat treatment at 400° C. under an oxygen partial pressure of $1\times10^{-3}$ Pa for five minutes. As understood from FIG. 10, when the film is formed at a room temperature, the low-dielectric-constant interfacial layer is generated due to the subsequent heat treatment to result in a reduction of the capacitance. Contrarily, when the film is formed at 600° C., the generation of the low-dielectric-constant interfacial layer is restrained by the subsequent heat treatment to result in high capacitance. This means that the film formed at 600° C. has a higher dielectric constant.

Here, FIG. 11 shows standard enthalpy of formation for various oxides at 25° C. As shown in FIG. 11, all the oxides listed herein are thermodynamically more stable than $SiO_2$. In addition, $La_2O_3$ is most stable among the oxides listed in FIG. 11, and $Al_2O_3$ is secondarily stable, so that a description in the present embodiment concerns the restraint on the generation of the low-dielectric-constant interfacial layer when LaAlO is used as the gate insulating film.

Furthermore, the generation of the low-dielectric-constant interfacial layer as described above cannot be avoided in the gate insulating film including at least the oxides listed in FIG. 11 not to mention LaAlO, and it is considered that this can be restrained by the process shown in the present embodiment. That is, in the oxide film of this kind, an ordinary process cannot avoid a plurality of peaks generated on the high binding energy side of the inflection point in the first differentiation of the O1s photoelectron spectrum and the shoulder peak generated in the O1s photoelectron spectrum, but the present invention can prevent this phenomena to form a satisfactory oxide film. In addition, when rare-earth oxides other than La are used for the gate insulating film, similar effects are conceivably provided because of similarity in chemical properties of the rare-earth oxides.

It is obvious from the above experimental results that the conditions to form the LaAlO film used as the gate insulating film desirably include the atmosphere at a temperature in a range from 500° C. to 800° C. and under an oxygen partial pressure of $1\times10^{-4}$ Pa or less.

It is to be noted the conditions have been described in the present embodiment wherein the generation of the low-dielectric-constant interfacial layer can be restrained using the laser ablation method, but effects of the invention are not limited by this method, and it is possible to use any method such as a sputtering method, a chemical vapor deposition (CVD) method or an atomic layer deposition (ALD) method as long as a high-dielectric-constant insulating film is formed by such a method in an oxygen environment in the same manner as the method described above. Further, the comparison at 400° C. has been shown for the heat treatment conditions in the present embodiment, but a tendency of a relation between a difference in the structures shown in the present embodiment and the restraint on the generation of the low-dielectric-constant interfacial layer does not depend on the heat treatment conditions.

As to the photoelectron spectrums of the present embodiment, the binding energy is corrected for all the spectrums so that a peak top of a C1s photoelectron spectrum corresponds to 285 eV. Moreover, an Al—Kα line (1486.6 eV) has been used as an excitation source of generating photoelectrons in obtaining the photoelectron spectrum, but X-ray energy is not limited as long as it can excite the photoelectrons. Still further, a concentric hemisphere energy analyzer has been used to measure kinetic energy of the photoelectrons, but a method of measuring the same is not limited, and any method can be applied to the spectrum of the photoelectrons as long as such a method can measure the kinetic energy of the photoelectrons. Further yet, an objective lens system, which is provided immediately before the sample to evaluate micro parts (less than 0.1 μm), may be applied to the measurement of photoelectron spectrum thereof.

A semiconductor device according to the present invention can be applied to a structure including the gate insulating film and a gate electrode in MISFET, a structure including the gate electrode and an insulating layer in a nonvolatile semiconductor memory element, a structure including the electrode and the insulating layer of the capacitor of a capacity element, etc. However, it is not limited thereto.

Second Embodiment

FIG. 12 is a sectional view showing an element structure of a semiconductor device (MOS transistor) according to a second embodiment of the present invention.

Reference numeral 10 in FIG. 12 denotes an n-type Si substrate in a plane direction (100), and an element formation area of this substrate 10 is separated by an isolation insulating film 11. A poly-Si gate electrode 13 is formed on the element formation area of the substrate 10 via a gate insulating film 12 including LaAlO. A side wall insulating film 14 comprising a Si nitride film is formed on a side surface of the gate electrode 13, and source/drain regions 15a, 15b comprising p-type diffused layers are formed on a surface of the substrate with the gate electrode 13 in between.

An interlayer insulating film 16 comprising a silicon oxide film is formed on the substrate 10 where the MOS transistor as described above is formed. Further, a contact hole is formed in the interlayer insulating film to contact the source/drain areas 15a, 15b, and a wiring electrode 17 such as Al is formed in an embedded manner in the contact hole.

Next, a method of manufacturing the semiconductor device of the present embodiment will be described referring to FIGS. 13A to 13D.

First, as shown in FIG. 13A, a trench for isolation is formed in the surface portion of the n-type Si substrate 10 in the plane direction (100), and the isolation insulating film 11 such as a silicon oxide film is formed in an embedded manner in the trench.

Next, as shown in FIG. 13B, the gate insulating film 12 including LaAlO having a thickness of about 2 nm to 5 nm is formed on the substrate surface, and then the gate electrode 13 comprising poly-Si is formed thereon. Here, when the gate insulating film 12 is formed, a laser ablation method in which an LaAlO$_3$ single-crystal substrate is a target is used, and a film formation condition is 600° C. under an oxygen partial pressure of $5\times10^{-5}$ Pa.

Then, as shown in FIG. 13C, the gate electrode 13 and the gate insulating film 12 are processed into a gate pattern. More specifically, an unshown resist is formed into the gate pattern on the gate electrode 13, and the gate electrode 13 and the gate insulating film 12 are subjected to selective etching using this gate pattern as a mask.

Then, as shown in FIG. 13D, the Si nitride film is deposited on an entire surface of a sample, and then the entire surface is etched back, thereby forming the side wall insulating film 14 on the side surface of the gate electrode 13. Then, ion implantation of p-type impurities is performed into the substrate surface using the gate electrode 13 and the side wall insulating film 14 as the mask, thereby forming the source/drain regions 15a, 15b.

Subsequently, the interlayer insulating film 16 is deposited, and the contact hole is formed, and the Al wiring film 17 is further formed, thereby making it possible to provide the structure shown in FIG. 12.

In the semiconductor device thus manufactured, the LaAlO film used as the gate insulating film 12 is satisfactorily formed without containing chain bonds of silicon (Si) and oxygen (O), and the MOS transistor having the high-dielectric-constant gate insulating film is achieved. That is, it is possible to take advantage of characteristics meaning the high dielectric constant intrinsic to a high-k material without generating a low-dielectric-constant interfacial layer during film formation and after a heat treatment. It is thus possible to contribute to realization of a next-generation MOS-type field effect transistor below a gate length of 0.1 μm.

(Modification)

It is to be noted that the present invention is not limited to the embodiments described above. An example of the MOSFET has been described as a device in the embodiments, but a gate insulating film of the present invention can also be applied to a nonvolatile semiconductor memory.

FIG. 14 is a sectional view showing an element structure of the nonvolatile semiconductor memory having a double layer gate structure, wherein 20 denotes a Si substrate, 21 denotes a tunnel insulating film, 22 denotes a floating gate, 23 denotes an inter-electrode insulating film, 24 denotes a control gate, and 25a, 25b denote source/drain regions. In this configuration, a high-k film (gate insulating film) of the present invention can be used as the inter-electrode insulating film 23 to increase coupling capacitance between the floating gate 22 and the control gate 24.

A material of the gate insulating film and the inter-electrode insulating film is not limited to LaAlO, and any material can be used as long as a high dielectric film contains a lanthanoid series metal. It is also possible to use Zr, Hf, Ti instead of the lanthanoid series metal, and any high-k film may be used if it contains at least one of Zr, Hf, Ti and the lanthanoid series metal.

Specifically, it includes a film comprising HfO, HfO$_2$, HfSiO$_4$, ZrO$_2$, ZrSiO$_4$, TiO$_2$, SrTiO$_3$, BaTiO$_3$, CaTiO$_3$, Ba$_x$Sr$_{1-x}$TiO$_3$, PbTiO$_3$, PbZr$_x$Ti$_{1-x}$O$_3$, CeO$_2$, HfAlO, HfAlON, etc.

Furthermore, the gate electrode may be polycrystalline SiGe or a metal gate electrode such as TiN, Mo, Au, Al, Pt, Ag or W.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor devices comprising:

forming a non-crystallized film consisting of La, Al, and O, to be in contact with the Si substrate as a gate insulating film on a Si substrate, at a temperature region of 500° C. to 800° C. and under an oxygen partial pressure of $1\times10^{-4}$ Pa or less;

forming a gate electrode on the gate insulating film; and after forming the gate electrode, performing a heat treatment without forming an interfacial layer between the Si substrate and the non-crystallized film consisting of La, Al, and O, wherein the forming of the non-crystallized film includes film formation by a laser ablation method using an LaAlO$_3$ single-crystal deposition source.

2. A method of manufacturing a semiconductor device, comprising:

forming a non-crystallized film consisting of La, Al, and O, to be in contact with the Si substrate as a gate insulating film on a Si substrate, at a temperature region of 500° C. to 800° C. and under an oxygen partial pressure of $1\times10^{-4}$ Pa or less:

forming a gate electrode on the gate insulating film; and after forming the gate electrode, performing a heat treatment without forming an interfacial layer between the Si substrate and the non-crystallized film consisting of La, Al, and O;

wherein the forming of the non-crystallized film includes using one method selected from the group consisting of a sputtering method, a CVD method, and an ALD method.

3. The method according to claim 1, wherein the forming of the gate electrode includes forming a floating gate electrode, forming an inter-electrode insulating film thereon, and forming a control gate electrode film thereon.

4. The method according to claim 1, further comprising forming source/drain regions on both sides of the gate electrode using the gate electrode as a mask.

* * * * *

UNITED STATES PATENT AND TRADEMARK OFFICE
CERTIFICATE OF CORRECTION

| | | |
|---|---|---|
| PATENT NO. | : 7,662,685 B2 | Page 1 of 1 |
| APPLICATION NO. | : 11/234217 | |
| DATED | : February 16, 2010 | |
| INVENTOR(S) | : Suzuki et al. | |

It is certified that error appears in the above-identified patent and that said Letters Patent is hereby corrected as shown below:

Title page, Item (57), in the Abstract, line 1, change "a Si" to --an Si--.

\* Claim 1, column 8, line 24, change "devices" to --device,--.

Claim 1, column 8, line 28, change "a Si" to --an Si--.

\* Claim 2, column 8, line 45, change "less:" to --less;--.

Signed and Sealed this

Seventeenth Day of August, 2010

David J. Kappos
*Director of the United States Patent and Trademark Office*